United States Patent
Lu et al.

(10) Patent No.: US 11,108,407 B1
(45) Date of Patent: Aug. 31, 2021

(54) PERFORMANCE OF A BIT FLIPPING (BF) DECODER OF AN ERROR CORRECTION SYSTEM

(71) Applicant: SK hynix Inc., Icheon-si (KR)

(72) Inventors: Xuanxuan Lu, San Jose, CA (US); Fan Zhang, Fremont, CA (US); Aman Bhatia, Los Gatos, CA (US); Meysam Asadi, Fremont, CA (US); Haobo Wang, San Jose, CA (US)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/813,342

(22) Filed: Mar. 9, 2020

(51) Int. Cl.
*H03M 13/00* (2006.01)
*H03M 13/11* (2006.01)
*H03M 13/01* (2006.01)
*H03M 13/43* (2006.01)
*H03M 13/09* (2006.01)

(52) U.S. Cl.
CPC ..... *H03M 13/1108* (2013.01); *H03M 13/015* (2013.01); *H03M 13/096* (2013.01); *H03M 13/1177* (2013.01); *H03M 13/43* (2013.01)

(58) Field of Classification Search
None
See application file for complete search history.

(56) References Cited

U.S. PATENT DOCUMENTS

| | | | | |
|---|---|---|---|---|
| 8,281,210 B1 * | 10/2012 | Farjadrad | ......... | H03M 13/6583 714/755 |
| 8,291,285 B1 * | 10/2012 | Varnica | ........... | H03M 13/116 714/752 |
| 8,495,479 B1 * | 7/2013 | Varnica | ............ | H03M 13/3746 714/794 |
| 9,614,547 B2 | 4/2017 | Fainzilber et al. | | |
| 10,084,479 B2 | 9/2018 | Hanham et al. | | |
| 10,218,388 B2 * | 2/2019 | Lin | ................. | H03M 13/2975 |

(Continued)

OTHER PUBLICATIONS

Catala-Perez, et al., "Reliability-Based Iterative Decoding Algorithm for LDPC Codes With Low Variable-Node Degree", IEEE Communications Letters, vol. 18, No. 12, Dec. 2014, pp. 2065-2068.

(Continued)

*Primary Examiner* — Mujtaba M Chaudry
(74) *Attorney, Agent, or Firm* — Weaver Austin Villeneuve & Sampson LLP

(57) ABSTRACT

Techniques are described for improving the decoding latency and throughput of an error correction system that includes a bit flipping (BF) decoder, where the BF decoder uses a bit flipping procedure. In an example, different decoding parameters are determined including any of a decoding number of a decoding iteration, a checksum of a codeword, a degree of a variable node, and a bit flipping threshold defined for the bit flipping procedure. Based on one or more of these decoding parameters, a decision can be generated to skip the bit flipping decoding procedure, thereby decreasing the decoding latency and increasing the decoding throughput. Otherwise, the bit flipping decoding procedure can be performed to compute a bit flipping energy and determine whether particular bits are to be flipped or not. Hence, the overall performance (e.g., bit error rate) is not significantly impacted.

20 Claims, 8 Drawing Sheets

(56) References Cited

U.S. PATENT DOCUMENTS

| | | | |
|---|---|---|---|
| 10,389,388 B2 | 8/2019 | Tate et al. | |
| 10,411,735 B1 | 9/2019 | Chilappagari et al. | |
| 10,432,232 B2 | 10/2019 | Zamir et al. | |
| 10,484,008 B2 | 11/2019 | Zhang et al. | |
| 2015/0349807 A1* | 12/2015 | Vernon | H03M 13/6577 |
| | | | 714/774 |
| 2018/0131389 A1* | 5/2018 | Xiong | G06F 3/0619 |
| 2019/0097652 A1 | 3/2019 | Xiong et al. | |
| 2019/0149175 A1 | 5/2019 | Kaynak et al. | |
| 2019/0238158 A1 | 8/2019 | Bhatia et al. | |
| 2019/0326931 A1* | 10/2019 | Liu | H03M 13/1122 |
| 2020/0136644 A1* | 4/2020 | Zeng | G11C 29/52 |

OTHER PUBLICATIONS

Webber, et al., "A Study on Adaptive Thresholds for Reduced Complexity Bit-Flip Decoding", 2012 14th International conference on Advanced Communication Technology (ICACT), Feb. 2012, pp. 497-501.

* cited by examiner $$200 \diagdown H = \begin{bmatrix} 1 & 0 & 1 & 0 & 0 & 1 \\ 1 & 1 & 0 & 0 & 1 & 0 \\ 1 & 0 & 0 & 1 & 0 & 0 \\ 0 & 1 & 0 & 1 & 0 & 1 \end{bmatrix}$$

PERFORMANCE OF A BIT FLIPPING (BF) DECODER OF AN ERROR CORRECTION SYSTEM

BACKGROUND OF THE INVENTION

Data integrity is an important feature for any data storage device and data transmission. Use of strong error-correction codes (ECCs) is recommended for various types of data storage devices include NAND flash memory devices. ECCs are also frequently used during the process of data transmission.

ECC refers to codes that add redundant data, or parity data, to a message, such that the message can be recovered by a receiver even when a number of errors were introduced, either during the process of transmission, or storage. In general, the ECC can correct the errors up to the capability of the code being used.

Low-density parity-check (LDPC) codes are an example of ECC. Generally, an LDPC error correction system is used to decode information bits. In certain implementations, the LDPC error correction system can include multiple LDPC decoders. Each of the LDPC decoders can be used to decode a set of the LDPC codes.

BRIEF SUMMARY OF THE INVENTION

Techniques are described for improving the decoding latency and throughput of an error correction system that includes a bit flipping (BF) decoder, where the BF decoder uses a bit flipping procedure. In an example, the error correction system implements a method performed during a decoding iteration and prior to performing the bit flipping procedure. The method includes selecting a set of variable nodes. A degree of each variable node of the set is a same for the variable nodes of the set. The method also includes determining the degree of a variable node of the set. The method also includes determining a decoding factor that includes at least one of: an iteration number "m" of the decoding iteration or a checksum of the LDPC codeword. The iteration number "m" is an integer equal to or greater than one. The method also includes determining a bit flipping threshold "T". The bit flipping threshold "T" is predefined for the bit flipping procedure based on the iteration number "m". The method also includes generating, based on degree, the decoding factor, and the bit flipping threshold "T", a decision indicating whether to perform or to skip the bit flipping procedure. The LDPC codeword is decoded based on the decision.

In an example, the method further includes performing a first comparison between the degree of the variable node and a degree threshold. The decision is generated based on an outcome of the first comparison. In an illustration, the degree threshold is equal to or less than five. In addition, the decoding factor includes the iteration number "m" and the method further includes performing a second comparison between the iteration number "m" and a number threshold and performing a third comparison between the bit flipping threshold "T" and one or more predefined values. The decision is generated based on an outcome of the second comparison and an outcome of the third comparison. In an illustration, each one of the one or more predefined values is a different value within a range that is defined based on the degree threshold. The decision is to skip performing the bit flipping procedure based on (i) the first comparison indicating that the degree is smaller than the degree threshold, (ii) the second comparison indicating that the iteration number "m" is smaller than the number threshold, and (iii) the third comparison indicating that the bit flipping threshold "T" is equal to any of the one or more predefined values. The decision is to perform the bit flipping procedure based on any of: (i) the first comparison indicating that the degree is greater than the degree threshold, (ii) the second comparison indicating that the iteration number "m" is greater than the number threshold, or (iii) the third comparison indicating that the bit flipping threshold "T" is not equal to any of the one or more predefined values. Alternatively, the decoding factor includes the checksum and the method further includes performing a second comparison between the checksum and a checksum threshold, and performing a third comparison between the bit flipping threshold "T" and one or more predefined values. The decision is generated based on an outcome of the second comparison and an outcome of the third comparison. The decision is to skip performing the bit flipping procedure based on (i) the first comparison indicating that the degree is smaller than the degree threshold, (ii) the second comparison indicating that the checksum is greater than the checksum threshold, and (iii) the third comparison indicating that the bit flipping threshold "T" is equal to any of the one or more predefined values. The decision is to perform the bit flipping procedure based on any of: (i) the first comparison indicating that the degree is greater than the degree threshold, (ii) the second comparison indicating that the iteration number is smaller than the checksum threshold, or (iii) the third comparison indicating that the bit flipping threshold "T" is not equal to any of the one or more predefined values.

In an example, the decision is to perform the bit flipping procedure. In this example, performing the bit flipping procedure includes computing a flipping energy for the variable node, performing a comparison of the flipping energy and the bit flipping threshold "T", and flipping one or more bits of the variable node based on the comparison indicating the flipping energy is greater than the bit flipping threshold "T".

In an example, an error correction system for decoding a low density parity check (LDPC) codeword includes a bit flipping (BF) decoder that is configured to perform operations during a decoding iteration and prior to performing a bit flipping procedure. The operations include selecting a set of variable nodes. A degree of each variable node of the set is a same for the variable nodes of the set. The operations also include determining the degree of a variable node of the set. The operations also include determining a decoding factor that includes at least one of: an iteration number "m" of the decoding iteration or a checksum of the LDPC codeword. The iteration number "m" is an integer equal to or greater than one. The operations also include determining a bit flipping threshold "T". The bit flipping threshold "T" is predefined for the bit flipping procedure based on the iteration number "m". The operations also include generating, based on degree, the decoding factor, and the bit flipping threshold "T", a decision indicating whether to perform or to skip the bit flipping procedure. The operations also include decoding the LDPC codeword based on the decision.

In an example, the BF decoder is further configured to perform a first comparison between the degree of the variable node and a degree threshold. The decision is generated based on an outcome of the first comparison. In this example, the degree threshold is equal to or less than five. Further, the decoding factor includes the iteration number "m", and the BF decoder is further configured to: perform a second comparison between the iteration number "m" and a number threshold, and perform a third comparison between the bit flipping threshold "T" and one or more predefined values. The decision is generated based on an outcome of the second comparison and an outcome of the third comparison. In an illustration, each one of the one or more predefined values is a different value within a range that is defined based on the degree threshold. The decision is to skip performing the bit flipping procedure based on (i) the first comparison indicating that the degree is smaller than the degree threshold, (ii) the second comparison indicating that the iteration number "m" is smaller than the number threshold, and (iii) the third comparison indicating that the bit flipping threshold "T" is equal to any of the one or more predefined values.

In an example, a memory device includes an error correction system and stores computer-readable instructions, that upon execution by the error correction system that includes a bit flipping (BF) decoder using a bit flipping procedure, cause the error correction system to perform operations. The operations include selecting a set of variable nodes. A degree of each variable node of the set is a the same for the variable nodes of the set. The operations also include determining the degree of a variable node of the set. The operations also include determining a decoding factor that includes at least one of: an iteration number "m" of the decoding iteration or a checksum of the LDPC codeword. The iteration number "m" is an integer equal to or greater than one. The operations also include determining a bit flipping threshold "T". The bit flipping threshold "T" is predefined for the bit flipping procedure based on the iteration number "m". The operations also include generating, based on degree, the decoding factor, and the bit flipping threshold "T", a decision indicating whether to perform or to skip the bit flipping procedure. The LDPC codeword is decoded based on the decision.

In an example, the operations further include performing a first comparison between the degree of the variable node and a degree threshold, wherein the decision is generated based on an outcome of the first comparison. In an illustration, the decoding factor includes the checksum and operations further include performing a second comparison between the checksum and a checksum threshold, and performing a third comparison between the bit flipping threshold "T" and one or more predefined values. The decision is generated based on an outcome of the second comparison and an outcome of the third comparison.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

Figure 4:
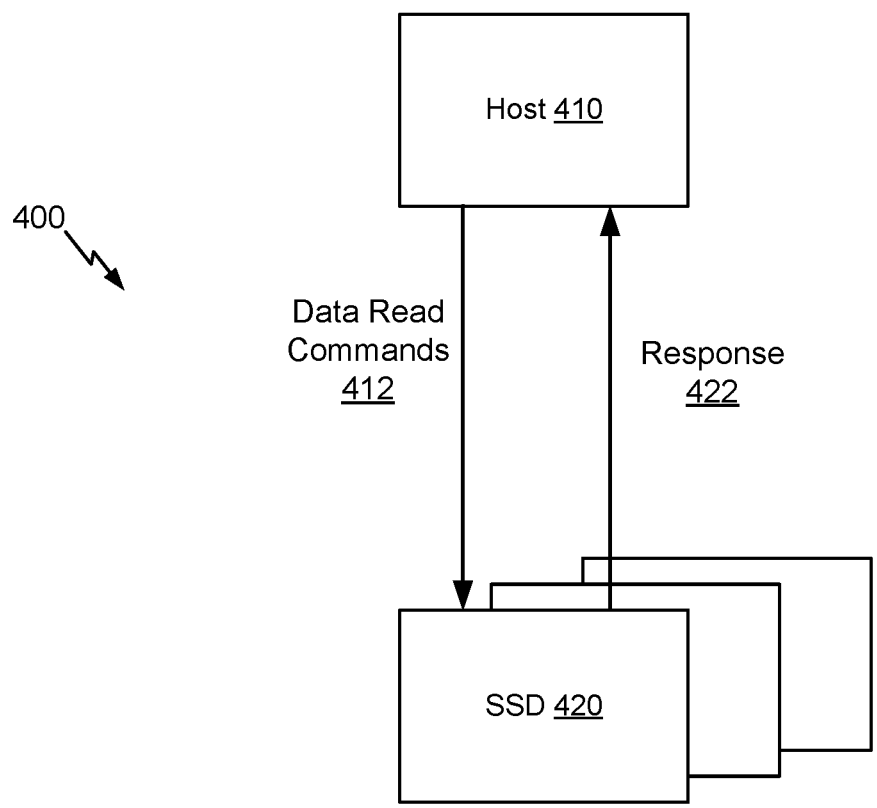
FIG. 4 illustrates an example architecture of a computer system, in accordance with certain embodiments of the present disclosure.

In many systems, including data storage derives that use NAND Flash technology, error correction systems can be implemented. In an example and as illustrated in FIG. 4, an error correction system can include multiple decoders, one or more of which have a relatively lower decoding latency and a higher decoding throughout (referred to herein as a low latency and high throughput decoder(s)), and one or more remaining ones having a relatively higher error correction capability (referred to herein as a high error correction capability decoder(s)). For instance, an LPDC error correction system implements a bit flipping (BF) decoder and min-sum (MS) decoder as a low latency and high throughput decoder and a high error correction capability decoder, respectively. Given the relatively lower decoding latency and higher decoding throughout, a larger number of codewords are typically decoded by the low latency and high throughput decoder (e.g., the BF decoder). Hence, further improving the decoding latency, decoding throughput, and efficiency of the low latency and high throughput decoder is important, especially in mobile and client solid state drives (SSD) applications because of their latency requirements, power constraints and throughput requirements.

Embodiments of the present disclosure enable such improvements. In an example, the low latency and high throughput decoder uses a decoding procedure to decode codewords. Prior to performing the decoding procedure, various decoding parameters are determined and assessed to intelligently decide whether the decoding procedure is to be performed or can be skipped. By skipping the decoding procedure when, otherwise, performing it would not provide any meaningful decoding gain reduces the decoding latency, increases the decoding throughput, and reduces the power consumption of the low latency and high throughput decoder. The various decoding parameters relate to the assessment of whether meaningful decoding gain can be likely obtained or not.

To illustrate, consider an example of an LDPC error correction system that implements the BF decoder. The BF decoder uses a bit flipping procedure to determine whether bits of variable nodes should be flipped or not by computing a bit flipping energy and comparing this bit flipping energy to a predefined bit flipping threshold "T". During a decoding iteration and prior to performing the bit flipping procedure, the BF decoder can determine a degree of a variable node, the iteration number "m" of the decoding iteration, and the bit flipping threshold "T". These three parameters are examples of the decoding parameters. If the iteration number is smaller than a number threshold (e.g., the decoding iteration is one of the early decoding iterations), the degree of the variable node is smaller than a degree threshold (e.g., the degree is small enough, whereby the variable node is not connected to too many check nodes), and the bit flipping threshold "T" is the same or close to the degree of the variable node, performing the bit flipping procedure does not likely result in meaningful decoding gain because any gained information is likely unreliable. Hence, when these threes conditions are met, the BF decoder skips the bit flipping decoding procedure. However, if any of the three conditions is not met, the bit flipping decoding procedure is performed.

In the interest of clarity of explanation, the embodiments of the present disclosure are described in connection with decoding LDPC codewords by using a BF decoder that implements a bit flipping procedure. However, the embodiments are not limited as such. Instead, the embodiments similarly apply to the decoding of any other types of ECCs by using any suitable decoder. The performance (including decoding latency, decoding throughput, and/or power consumption) of the decoder can be improved by assessing the various decoding parameters and intelligently deciding whether the relevant decoding procedure is to be performed or skipped. The decoding parameters relate to assessing the likely decoding gain if the decoding procedure was performed by qualitatively or quantitatively estimating the reliability of the outcome resulting from performing the decoding procedure.

Figure 1:
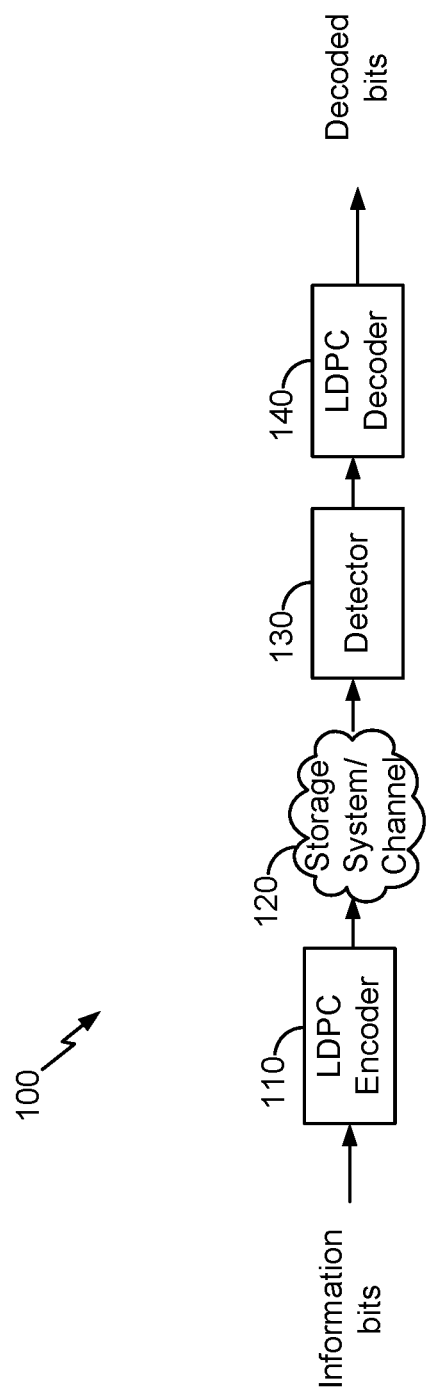
FIG. 1 illustrates an example high level block diagram of an error correcting system, in accordance with certain embodiments of the present disclosure.

FIG. 1 illustrates an example high level block diagram of an error correcting system 100, in accordance with certain embodiments of the present disclosure. In the example, LDPC codes are described in connection with data storage. However, the embodiments of the present disclosure are not limited as such. Instead, the embodiments similarly apply to other usage of LDPC codes including, for example, data transmission. Further, the embodiments of the present disclosure can similarly apply to other error correction codes for which the above factors can be computed.

LDPC codes are linear block codes defined by a sparse parity-check matrix H, which consists of zeros and ones. The term "sparse matrix" is used herein to refer to a matrix in which a number of non-zero values in each column and each row is much less than its dimension. The term "column weight" is used herein to refer to the number of non-zero values in a specific column of the parity-check matrix H. The term "row weight" is used herein to refer to a number of non-zero values in a specific row of the parity-check matrix H. In general, if column weights of all of the columns in a parity-check matrix corresponding to an LDPC code are similar, the code is referred to as a "regular" LDPC code. On the other hand, an LDPC code is called "irregular" if at least one of the column weights is different from other column weights. Usually, irregular LDPC codes provide better error correction capability than regular LDPC codes.

The LDPC codes are also described according to the way they are constructed. Random computer searches or algebraic constructions are possible. The random computer search construction describes an LDPC code having a parity-check matrix designed by a random computer-based procedure. Algebraic construction implies that the parity-check matrix has been constructed based on combinatorial methods. Quasi-cyclic LDPC (QC-LDPC) codes fall under the latter construction method. One advantage of QC-LDPC codes is that they have a relatively easier implementation in terms of the encoding procedure. The main feature of QC-LDPC codes is that the parity-check matrix consists of circulant submatrices, which could be either based on an identity matrix or a smaller random matrix. Permutation vectors could also be used in order to create the circulant submatrices.

As illustrated, an LDPC encoder 110 receives information bits that include data which is desired to be stored in a storage system 120. LDPC encoded data is output by the LDPC encoder 110 and is written to the storage 120.

In various embodiments, the storage 120 may include a variety of storage types or media such as (e.g., magnetic) disk drive storage, flash storage, etc. In some embodiments, the techniques are employed in a transceiver and instead of being written to or read from storage, the data is transmitted and received over a wired and/or wireless channel. In this case, the errors in the received codeword may be introduced during transmission of the codeword.

When the stored data is requested or otherwise desired (e.g., by an application or user which stored the data), a detector 130 receives data from the storage system 120. The received data may include some noise or errors. The detector 130 performs detection on the received data and outputs decision and/or reliability information. For example, a soft output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain or sure the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty).

The decision and/or reliability information is passed to a LDPC decoder 140 which performs LDPC decoding using the decision and reliability information. A soft input decoder utilizes both the decision and the reliability information to decode the codeword. A hard decoder utilizes only the decision values in the decoder to decode the codeword. The decoded bits generated by the LDPC decoder 140 are passed to the appropriate entity (e.g., the user or application which requested it). With proper encoding and decoding, the information bits match the decoded bits.

In various embodiments, the system shown may be implemented using a variety of techniques including an application-specific integrated circuit (ASIC), a field-programmable gate array (FPGA), and/or a general purpose processor (e.g., an Advanced RISC Machine (ARM) core).

LDPC codes are usually represented by bipartite graphs. One set of nodes, the variable or bit nodes correspond to elements of the codeword and the other set of nodes, e.g., check nodes, correspond to the set of parity-check constraints satisfied by the codeword. Typically the edge connections are chosen at random. The error correction capability of an LDPC code is improved if cycles of short length are avoided in the graph. In a (r,c) regular code, each of the n variable nodes (V1, V2, ..., Vn) has connections to r check nodes and each of the m check nodes (C1, C2, ..., Cm) has connections to c bit nodes. In an irregular LDPC code, the check node degree is not uniform. Similarly the variable node degree is not uniform. In QC-LDPC codes, the parity-check matrix H is structured into blocks of p×p matrices such that a bit in a block participates in only one check equation in the block, and each check equation in the block involves only one bit from the block. In QC-LDPC codes, a cyclic shift of a codeword by p results in another codeword. Here p is the size of a square matrix which is either a zero matrix or a circulant matrix. This is a generalization of a cyclic code in which a cyclic shift of a codeword by 1 results in another codeword. The block of p×p matrix can be a zero matrix or cyclically shifted identity matrix of size p×p.

Figures 2A, 2B:
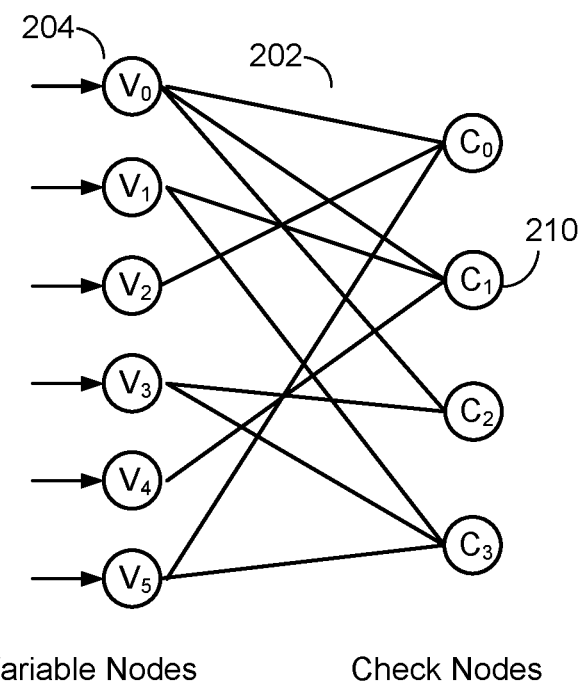
FIGS. 2A-2B illustrate an example parity-check matrix and an example graph representing the parity-check matrix, in accordance with certain embodiments of the present disclosure.

FIG. 2A illustrates an example parity-check matrix H 200 and FIG. 2B illustrates an example bipartite graph corresponding to the parity-check matrix 200, in accordance with certain embodiments of the present disclosure. In this example, the parity-check matrix 200 has six column vectors and four row vectors. Network 202 shows the network corresponding to the parity-check matrix 200 and represent a bipartite graph. Various type of bipartite graphs are possible, including, for example, a Tanner graph.

Generally, the variable nodes in the network 202 correspond to the column vectors in the parity-check matrix 200. The check nodes in the network 202 correspond to the row vectors of the parity-check matrix 200. The interconnections between the nodes are determined by the values of the parity-check matrix 200. Specifically, a "1" indicates the corresponding check node and variable nodes have a connection. A "0" indicates there is no connection. For example, the "1" in the leftmost column vector and the second row vector from the top in the parity-check matrix 200 corresponds to the connection between the variable node 204 and the check node 210.

A message passing algorithm is generally used to decode LDPC codes. Several variations of the message passing algorithm exist in the art, such as min-sum (MS) algorithm, sum-product algorithm (SPA) or the like. Message passing uses a network of variable nodes and check nodes, as shown in FIG. 2B. The connections between variable nodes and check nodes are described by and correspond to the values of the parity-check matrix 200, as shown in FIG. 2A.

A hard decision message passing algorithm may be performed. In a first step, each of the variable nodes sends a message to one or more check nodes that are connected to it. In this case, the message is a value that each of the variable nodes believes to be its correct value.

In the second step, each of the check nodes calculates a response to send to the variable nodes that are connected to it using the information that it previously received from the variable nodes. This step can be referred as the check node update (CNU). The response message corresponds to a value that the check node believes that the variable node should have based on the information received from the other variable nodes connected to that check node. This response is calculated using the parity-check equations which force the values of all the variable nodes that are connected to a particular check node to sum up to zero (modulo 2).

At this point, if all the equations at all the check nodes are satisfied, the decoding algorithm declares that a correct codeword is found and it terminates. If a correct codeword is not found, the iterations continue with another update from the variable nodes using the messages that they received from the check nodes to decide if the bit at their position should be a zero or a one by a majority rule. The variable nodes then send this hard decision message to the check nodes that are connected to them. The iterations continue until a correct codeword is found, a certain number of iterations are performed depending on the syndrome of the codeword (e.g., of the decoded codeword), or a maximum number of iterations are performed without finding a correct codeword. It should be noted that a soft-decision decoder works similarly, however, each of the messages that are passed among check nodes and variable nodes, also include reliability of each bit.

An example message passing algorithm may be performed. In this example, L(qij) represents a message that is sent by variable node $v_i$ to check node $c_j$; L($r_{ji}$) represents the message sent by check node $c_j$ to variable node $v_i$; and L($c_i$) represents initial LLR value for each variable node $v_i$. Variable node processing for each L(qij) can be done through the following steps:

(1) Read L($c_i$) and L($r_{ji}$) from memory.
(2) Calculate L(Qi-sum)=L($c_i$)+Scaling Factor*$\Sigma_{j \in c_i}$L($r_{ij}$).
(3) Calculate each L(Qi-sum)−L($r_{ij}$).
(4) Output L(Qi-sum) and write back to memory.
(5) If this is not the last column of the memory, go to Step 1 and increment i by one.
(6) Compute parity-check-sums (e.g., syndrome), if they are all equal to zero, the number of iterations reaches a threshold and the parity-check-sums are greater than another threshold, or the number of iterations equals a maximum limit, stop; otherwise, perform check node processing.

Check node processing for each L(rji) can be performed as follows:
(1) Read one row of qij from memory.
(2) Calculate L(Rj-sum) as follows:

$$L(Rj\text{-sum})=(\Pi_{i' \in R_j}\alpha_{i'j})\varphi(\Sigma_{i' \in R_j}\varphi(\beta_{i'j}))$$

$$\alpha_{ij}=\text{sign}(L(q_{ij})), \beta_{ij}=|L(q_{ij})|,$$

$$\varphi(x) = -\log\left(\tanh\left(\frac{x}{2}\right)\right) = \log\left(\frac{e^x+1}{e^x-1}\right)$$

(3) Calculate the individual L($r_{ji}$)=$(\Pi_{i' \in R_{j \setminus i}}\alpha_{i'j})\varphi(\Sigma_{i' \in R_{j \setminus i}}\varphi(\beta_{i'j}))$ for check nodes.
(4) Write back L($r_{ji}$) to memory.
(5) If this is not the last row of memory, then go to the first step and increment j by one.

Figure 3:
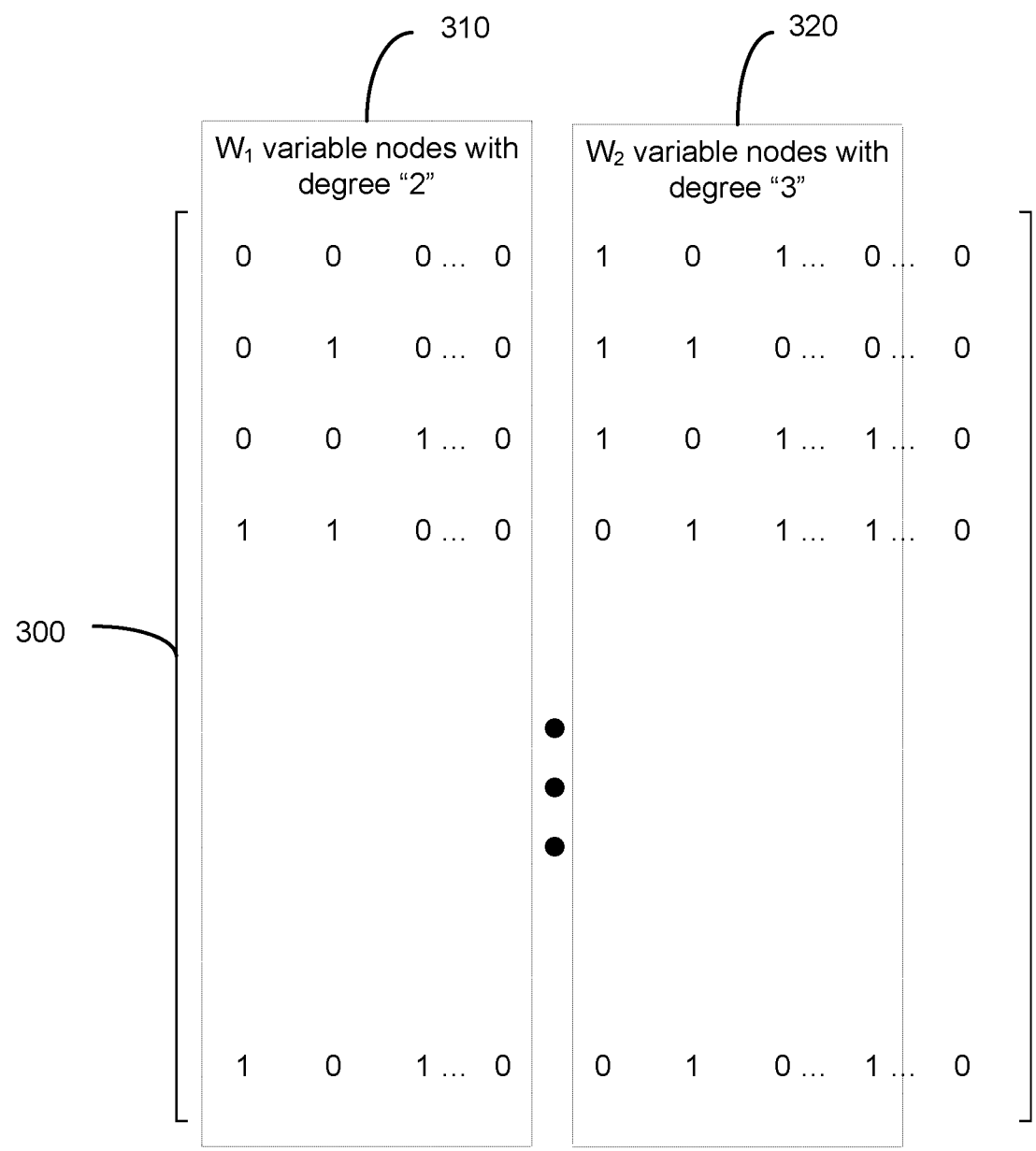
FIG. 3 illustrates an example representation of sets of variable nodes usable in vertical decoding of codewords, in accordance with certain embodiments of the present disclosure.

FIG. 3 illustrates an example representation of sets of variable nodes usable in vertical decoding of codewords, in accordance with certain embodiments of the present disclosure. As described herein above, a parity-check matrix H 300 can be used in the decoding of LDPC codewords. In an example, the parity-check matrix H 300 includes circulant submatrices. A circulant submatrix corresponds to a matrix within the parity-check matrix H 300, where the different columns of this matrix have the same weight. In other words, each column of the parity-check matrix H 300 corresponds to a variable node. A "1" in a column corresponding to a variable node represents a connection of the variable node with a check node. The total number of "1"s in the column represents the total number of connections, and this total number is the weight of the column and is the degree of the variable node. The variable nodes represented in a circular submatrix have the same number of "1"s and, hence, the same number of connections with check nodes (although the check nodes can be different) and the same degree.

In the example illustration of FIG. 3, the parity-check matrix H 300 includes a first circulant submatrix 310 and a second circulant submatrix 320, among multiple circulant submatrices. The first circulant submatrix 310 includes a positive integer number "$W_1$" of columns representing "$W_1$" variable nodes. Each of these variable nodes has a degree of two. Similarly, the second circulant submatrix 32 includes a positive integer number "$W_2$" of columns representing "$W_2$" variable nodes. Each of these variable nodes has a degree of three.

Generally, the parity-check matrix H 300 includes sets of "$W_i$" variable nodes (represented by "$W_i$" columns). Each set has the same degree. The degrees can vary between the sets and some of the sets can have the same degree. In an example, the degree of a set of "$W_i$" variable nodes (e.g., of each variable in the set) can be a value between one and twenty. Degrees that are less than or equal to five are referred to as low degrees. Degrees that are greater than or equal to six are referred to as high degrees. The positive integer number "$W_i$" for each set of variable nodes represents the size of the set (e.g., the number of variable nodes, or equivalently, columns) and can be a value between one and two thousand forty eight. For instance "$W_1$" can be one-hundred twenty-eight and instance "$W_2$" can be two-hundred fifty-six.

Vertical decoding can be performed based on the parity-check matrix H 300. For example, the decoding can be performed by selecting and processing a set of $W_i$" variable nodes prior to the selecting and processing of a next set of "$W_i$" variable nodes. For instance, the variable nodes in the "$W_1$" set are processed first, then the variable nodes in the "$W_2$" set, and so on and so forth. An example of the vertical decoding is further described in connection with FIG. 7.

FIG. 4 illustrates an example architecture of a computer system 400, in accordance with certain embodiments of the present disclosure. In an example, the computer system 400 includes a host 410 and one or more SSDs 420. The host 410 stores data on behalf of clients in the SSDs 420. The data is stored in an SSD as codewords for ECC protection. For instance, the SSD can include an ECC encoder (e.g., the LDPC encoder 110 of FIG. 1).

The host 410 can receive a request of client for the client's data stored in the SSDs 400. In response, the host sends data read commands 412 to the SSDs 420 as applicable. Each of such SSDs 420 processes the received data read command and sends a response 422 to the host 410 upon completion of the processing. The response 422 can include the read data and/or a decoding failure. In an example, each of the SSDs includes an ECC decoder (e.g., the LDPC decoder 140 of FIG. 1). The ECC decoder can include multiple decoders, including a BF decoder that uses a bit flipping procedure. Processing the data read command and sending the response 422 includes decoding by the ECC decoder the codewords stored in the SSD to output the read data and/or the decoding failure. Some of the codewords are decoded by the BF decoder. The BF decoder may use vertical decoding and can generate a decision as to whether the bit flipping procedure can be skipped or is to be performed to improve the BF decoder's performance.

Generally, an SSD can be a storage device that stores data persistently or caches data temporarily in nonvolatile semiconductor memory and is intended for use in storage systems, servers (e.g., within datacenters), and direct-attached storage (DAS) devices. A growing number of applications need high data throughput and low transaction latency and SSDs are used as a viable storage solution to increase the performance, efficiency, reliability and lowering overall operating expenses. SSDs generally use NAND flash memory and deliver higher performance and consume less power than spinning hard-disk drives (HDDs). NAND Flash memory has a number of inherent issues associated with it, the two most important include a finite life expectancy as NAND Flash cells wear out during repeated writes, and a naturally occurring error rate. SSDs can be designed and manufactured according to a set of industry standards that define particular performance specifications, including latency specifications, to support heavier write workloads, more extreme environmental conditions and recovery from a higher bit error rate (BER) than a client SSD (e.g., personal computers, laptops, and tablet computers).

Figure 5:
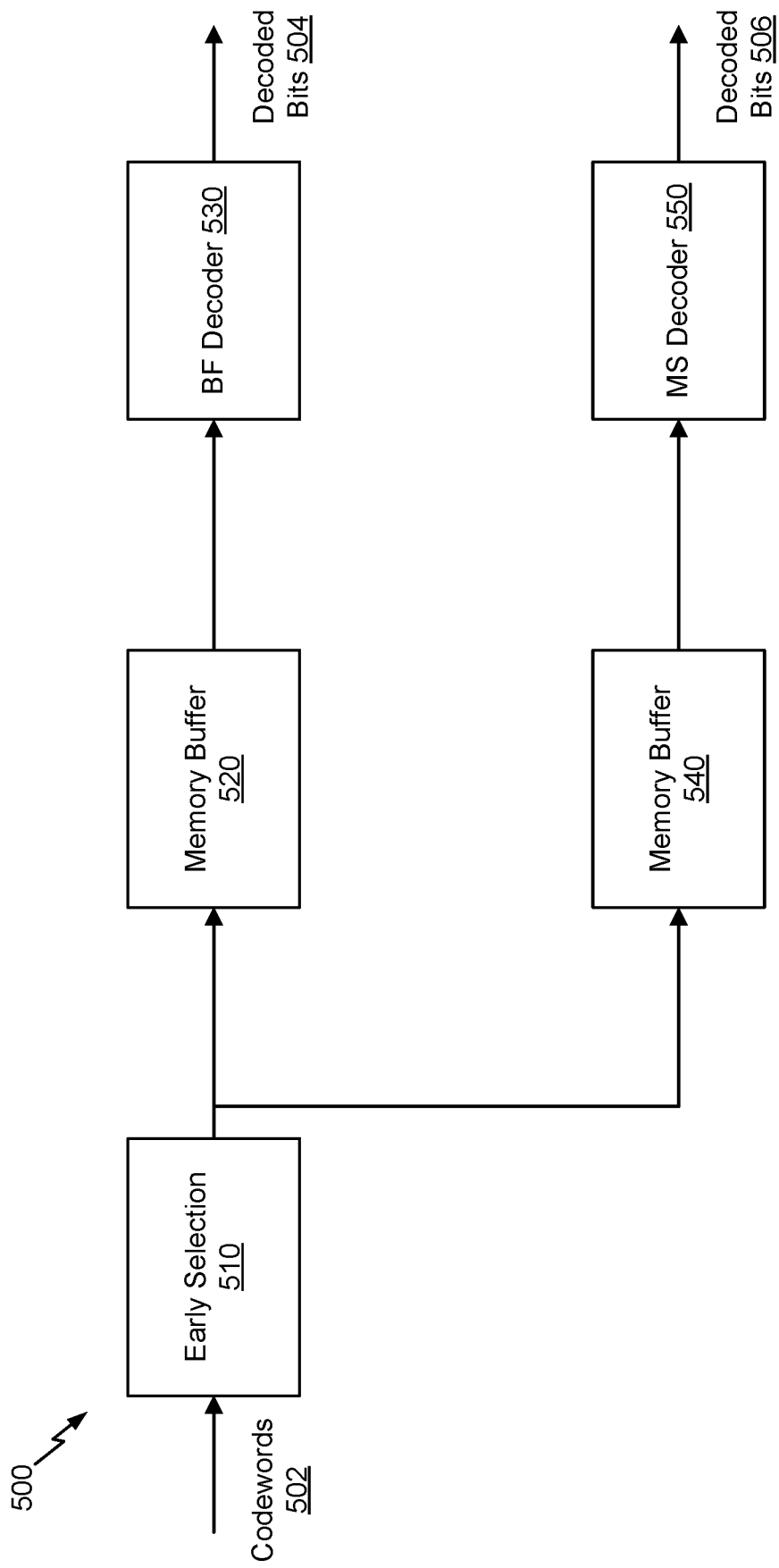
FIG. 5 illustrates an example error correction system that includes multiple decoders, in accordance with certain embodiments of the present disclosure.

FIG. 5 illustrates an example error correction system 500 that includes multiple decoders, in accordance with certain embodiments of the present disclosure. The error correction system 500 can be included in a memory device, such as the SSD 420 of FIG. 4. In turn, the error correction system 500 includes a controller 510, a memory buffer 520 corresponding to a bit flipping (BF) decoder 530, and a memory buffer 540 corresponding to a min-sum decoder 550. The controller 510 determines which of the two decoders 530 and 550 are to be used to decode different codewords 502 based on an estimate of the number of raw bit-errors for each of the codewords. The bit-errors can be due to noise and, accordingly, the codewords 502 can be noisy codewords. The BF decoder 530 outputs decoded bits 504 corresponding to one or more of the codewords 502, where the decoded bits 504 remove some or all of the noise (e.g., correct the error bits). Similarly, the decoder 550 outputs decoded bits 506 corresponding to remaining one or more of the codewords 502, where the decoded bits 506 remove some or all of the noise (e.g., correct the error bits).

If the controller 510 determines that a codeword has a severe bit error rate, a decoding failure is likely with the two decoders 530 and 550. Otherwise, the codeword can be dispatched to the BF decoder 530 when the controller 510 determines that the bit-error rate falls into the BF correction capability. Alternatively, the codeword can be dispatched to the MS decoder 550 when the controller 510 determines that the bit-error rate is outside of the BF correction capability. Dispatching the codeword includes storing the codeword into one of the memory buffers 520 or 540 depending on the controller's 510 determination. The memory buffers 520 and 540 are used because, in certain situations, the decoding latency is slower than the data read rate of a host reading the codewords 512.

Accordingly, over time, the codewords 512 are stored in different input queues for the BF decoder 530 and the MS decoder 550. For typical SSD usage, it is expected that most traffic would go to the BF decoder 530. Hence, it is important that the BF decoder's 530 performance is improved. Although FIG. 5 illustrates only one low latency and high throughput decoder (e.g., the BF decoder 530) and one high error correction capability decoder (e.g., an MS decoder 550), a different number of decoders can be used. For instance, a second BF decoder can be also used and can have the same or a different configuration than the BF decoder 530.

In an example, the BF decoder 530 may process a fixed number "$W_i$" of variable nodes in one clock-cycle. In other words, for each of the "$W_i$" variable nodes to be processed in this cycle, the BF decoder 530 counts the number of neighboring check-nodes that are unsatisfied and compares this number with a threshold. If the count is larger than the threshold, the BF decoder 530 flips the current bit-value of the variable node. However, this approach takes many cycles to process all the variable nodes of the LDPC codes in each decoding iteration. More efficient decoding approaches are desirable to achieve lower decoding-latency and higher throughput for the BF decoder without increasing the hardware area.

The BF decoder 530 processes "$W_i$" variable nodes in one clock-cycle. Embodiments of the present disclosure improve the performance of the BF decoder 530, where the BF decoder 530 is enabled to skip the processing of the variable nodes with low degree (e.g. smaller than or equal to five) and instead processes variable nodes with higher degrees (greater than or equal to the six). The decision to skip low degree variable nodes can depend on any of the current threshold values, the number of decoding iterations completed, and/or the total number of unsatisfied check nodes. With this approach, the number of clock-cycles required per decoding iteration is reduced. This improves the decoding latency and decoding throughput of the BF decoder 530 and the overall performance of the error correction system 500.

Reducing the number of clock-cycles for each decoding iteration of the BF decoder 530 without adding new hardware to process more than "$W_i$" variable nodes in each clock-cycle provides several advantages. The BF decoder 530 would skip the processing for all the variable nodes with low degrees when it is not expected to correct many errors. This can be the case when, for example, the threshold for flipping the bit is close to the degree of the variable node. Other methods for deciding when to skip low degree variable node processing may also depend on the iteration number and the total number of unsatisfied check nodes (e.g., the checksum).

In an example illustration, LDPC codes are decoded by using variable nodes of degrees two and six. The BF decoder 530 implements a method for deciding whether a bit flipping procedure is to be skipped or not. The method includes multiple steps. In a first step, the BF decoder 530 computes the parity-check equations. If all of these parity constraints are satisfied, then decoding stops. Assuming that the decoding is not stopped, in a second step, the BF decoder 530 proceeds to performing BF decoding based on vertical scheduling. At each decoding iteration "m", if the iteration number "m" is less than a predefined threshold "$T_m$" (or the checksum is larger than a predefined threshold "$T_c$"), if the degree of a majority of the "$W_i$" variable nodes is two and the bit flipping threshold "T" is two or three (e.g., the same as or slightly larger than the degree of two), the BF decoder 530 skips the bit flipping procedure and proceeds to the next set of $W_i$" variable nodes. For $W_i$" variable nodes that have a degree of six, the bit flipping procedure is performed. For selected $W_i$" variable nodes having a degree of six, the BF decoder 530 finds the number of unsatisfied parity-check equations and computes the flipping energy. If the flipping energy is larger than the bit flipping threshold "T", the BF decoder 530 flips the bit value. In a fourth step, the cyclic redundancy check (CRC) parity bits are determined at the end of the decoding iteration and the BF decoder 530 checks if the CRC matches with the CRC bits in the user bits. If they match, the BF decoder 530 further compares the LDPC checksum to a predefined threshold "$T_s$". If the LDPC syndrome degree is less than the predefined threshold "$T_s$", the BF decoder 530 is terminated and the BF decoder 530 outputs the current decision as a decoder output. Thereafter, the second and third step are repeated until the checksum is zero, CRC is satisfied and the checksum value is less than the predefined threshold "$T_s$", or until a predefined maximum iteration number is reached.

When the LDPC codes are quasi-cyclic, the "$W_i$" variable nodes may belong to the same circulant-column such that the degree of all "$W_i$" variable nodes is equal. Accordingly, determining the next "$W_i$" variable nodes to be processed becomes easier and does not necessitate additional gates in the hardware implementation (e.g., no hardware complexity is added).

Hence, the BF decoder 530 can skip the processing for all the variable nodes with low degree depending on the threshold, iteration number, checksum and/or or some combination of the decoding parameters. These decoding parameters are observable metrics.

Figure 6:
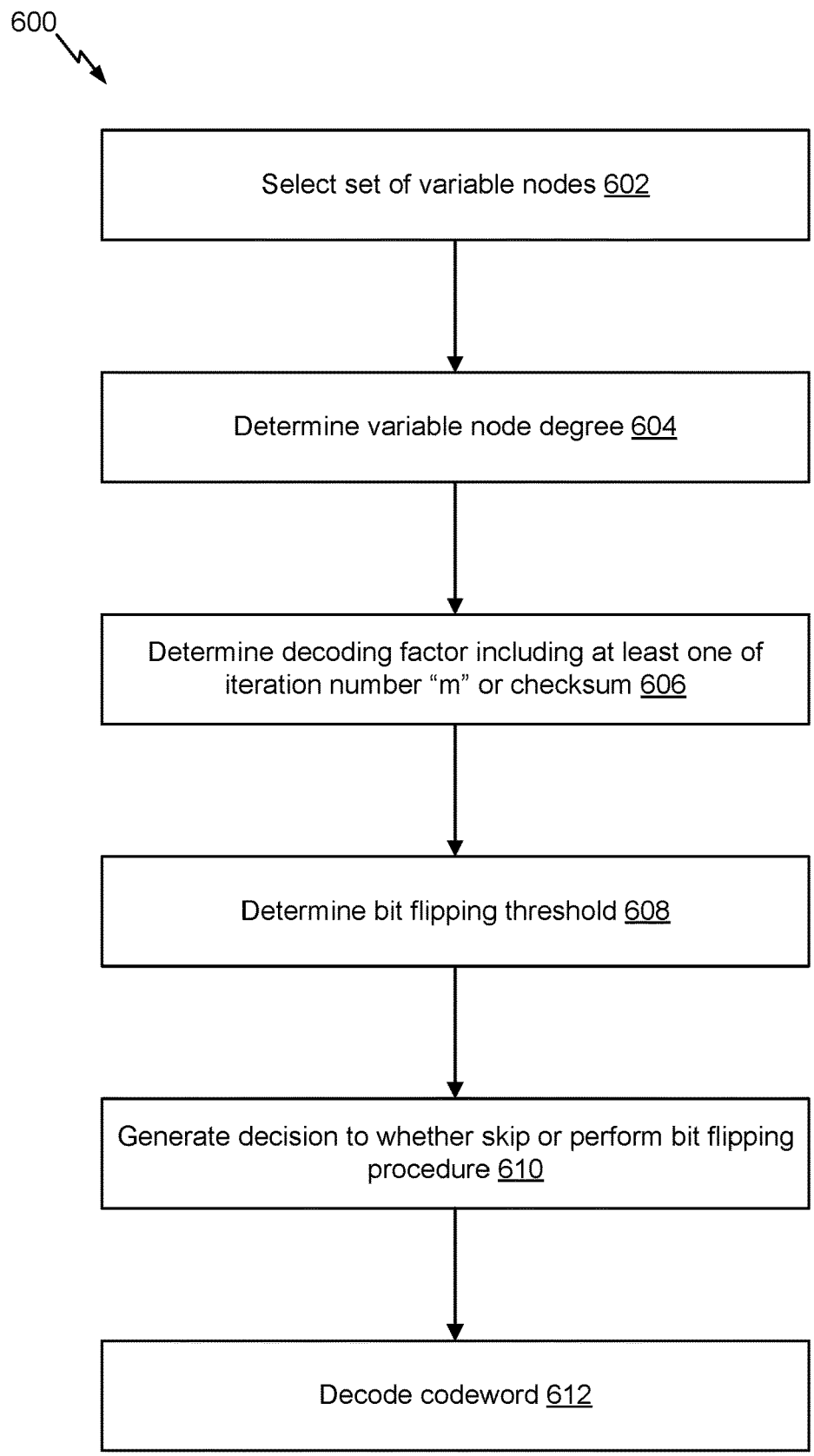
FIG. 6 illustrates an example flow for decoding codewords by determining whether a bit flipping procedure can be skipped or not, in accordance with certain embodiments of the present disclosure.
Figure 7:
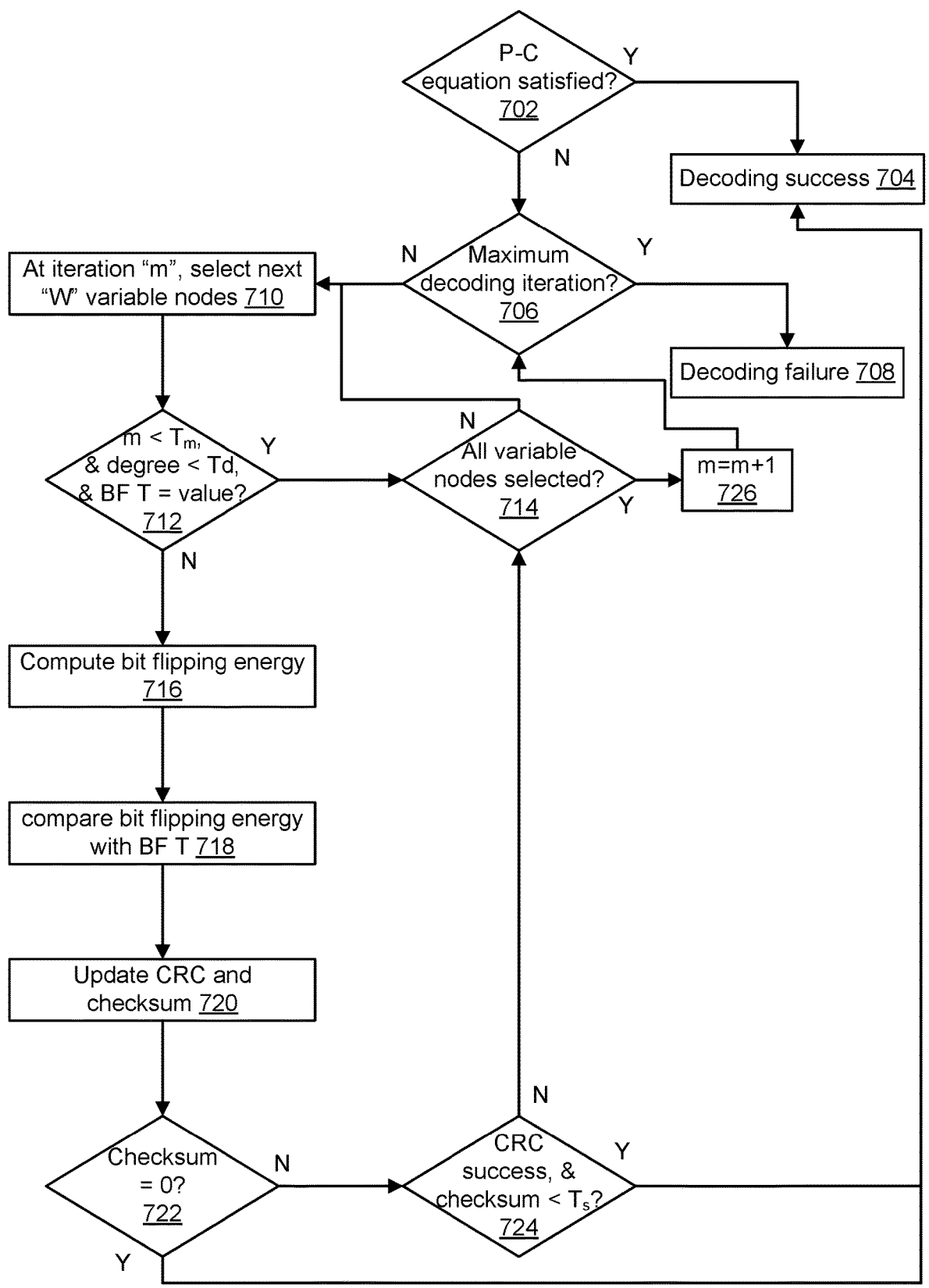
FIG. 7 illustrates a further example flow for decoding codewords by determining whether a bit flipping procedure can be skipped or not, in accordance with certain embodiments of the present disclosure.

FIGS. 6-7 illustrate example flows for decoding codewords using a BF decoder (or, similarly, any low decoding latency and high decoding throughput decoder). An error correction system that includes the BF decoder, among possibly other decoders, is described as performing particular operations of the example flows. This system is an example of the error correction system 500 of FIG. 5. In an example, the error correction system includes one or more processors and one or more memories. The memory(ies) stores computer-readable instructions to embody functionalities specific to the error correction system. The instructions when executed by the processor(s) of the system result in performance of the functionalities by the system. The instructions stored in the memory(ies) in conjunctions with the underlying processor(s) represent means for performing the functionalities. Although the operations are illustrated in a particular order, other arrangement of the operations are possible and some of the operations may be skipped as it would be apparent to a person skilled in the art. In the interest of clarity of explanation, the example flows are illustrated in connection with the decoding of an LDPC codeword. However, the example flows similarly apply to the decoding of a larger number of codewords.

FIG. 6 illustrates an example flow 600 for decoding codewords by determining whether a bit flipping procedure of the BF decoder can be skipped or not, in accordance with certain embodiments of the present disclosure. As illustrated, the flow 600 can start at operation 602, where the error correction system selects a set of variable nodes (e.g., "$W_i$" variable nodes). For instance, a parity-check matrix is used and includes circulant submatrices, similar to the parity-check matrix H 300 of FIG. 3. Accordingly, the parity-check matrix includes sets of columns, where each set represent variable nodes having a same degree. There may be multiple sets, each set including at least one column, and the degrees of the different sets can vary between one and ten. The selection can follow a vertical decoding schedule.

At operation 604, the error correction system determines the degree of the variable nodes of the selected set. The degree is the same for the different variable nodes. The degree can be determined as the weight from one of the corresponding columns in the parity-check matrix.

At operation 606, the error correction system determines a decoding factor including at least one of an iteration number "m" or a checksum. The iteration number "m" can correspond to the current number of the decoding iteration. The checksum can correspond to the codeword being decoded and can be equal to the number of unsatisfied check nodes from the last decoding iteration.

At operation 608, the error correction system determines a bit flipping threshold "T". The bit flipping threshold "T" is predefined for the bit flipping procedure based on the iteration number "m". Generally, the greater the iteration number "m", the greater the bit flipping threshold "T" is.

At operation 610, the error correction system generates a decision indicating whether to perform or to skip the bit flipping procedure. The decision can be generated based on the degree, the decoding factor, and the bit flipping threshold "T". Generally, the decision is generated during the decoding iteration and prior to performing the bit flipping decoding procedure during this decoding iteration. In other words, operations 602-610 are performed during the decoding iteration and prior to performing the bit flipping decoding procedure during this decoding iteration.

In an example, to generate the decision, the BF decoder performs a first comparison between the degree of the variable node and a degree threshold "$T_d$". The degree threshold "$T_d$" can be set at the boundary between low degree variable nodes and high degree variable nodes or as a value smaller than this boundary. For instance, the degree threshold "$T_d$" is equal to or less than five. Referring to the example described in connection with FIG. 2, the degree threshold "$T_d$" is two.

When the decoding factor includes iteration number "m", the BF decoder also performs a second comparison between the iteration number "m" and a number threshold "$T_m$", and performs a third comparison between the bit flipping threshold "T" and one or more predefined values. The decision is generated based on an outcome of the first comparison, an outcome of the second comparison, and an outcome of the third comparison. Each one of the one or more predefined values is a different value within a range that is defined based on the degree threshold "$T_d$", so that the third comparison is used to determine whether the bit flipping threshold "T" is the same as or sufficiently close to the degree of the sets of variable nodes. If so, the bit flipping decoding may be skipped.

In this example, the BF decode generates a decision to skip performing the bit flipping procedure for the selected set of variable nodes based on (i) the first comparison indicating that the degree is smaller than the degree threshold, (ii) the second comparison indicating that the iteration number "m" is smaller than the number threshold, and (iii) the third comparison indicating that the bit flipping threshold "T" is equal to any of the one or more predefined values. Conversely, the decision is to perform the bit flipping procedure based on any of: (i) the first comparison indicating that the degree is greater than the degree threshold, (ii) the second comparison indicating that the iteration number "m" is greater than the number threshold, or (iii) the third comparison indicating that the bit flipping threshold "T" is not equal to any of the one or more predefined values.

Referring back to the example illustration described in connection with FIG. 5, the number threshold "$T_m$" is set to five (or a smaller value), the degree threshold "$T_d$" is set to two, and the one or more predefined values are set to two and three. In this illustration, if the iteration number "m" is less than five, the degree is smaller or equal to two, and the predefined threshold "T" is equal to two or three, the bit flipping procedure is skipped. Otherwise, the bit flipping procedure is performed.

A similar approach can be followed when the decoding factor includes the checksum. In particular, the BF decoder also performs a second comparison between the checksum and a checksum threshold "$T_c$", and performs a third comparison between the bit flipping threshold "T" and one or more predefined values. The decision is generated based on an outcome of the first comparison, an outcome of the second comparison, and an outcome of the third comparison. Each one of the one or more predefined values is a different value within a range that is defined based on the degree threshold "$T_d$", so that the third comparison is used to determine whether the bit flipping threshold "T" is the same as or sufficiently close to the degree of the sets of variable nodes. If so, the bit flipping decoding may be skipped.

In this example, the BF decode generates a decision to skip performing the bit flipping procedure for the selected set of variable nodes based on (i) the first comparison indicating that the degree is smaller than the degree threshold, (ii) the second comparison indicating that the checksum is greater than the checksum "$T_c$", and (iii) the third comparison indicating that the bit flipping threshold "T" is equal to any of the one or more predefined values. Conversely, the decision is to perform the bit flipping procedure based on any of: (i) the first comparison indicating that the degree is greater than the degree threshold, (ii) the second comparison indicating that the checksum is smaller than the checksum "$T_c$", or (iii) the third comparison indicating that the bit flipping threshold "T" is not equal to any of the one or more predefined values.

Referring back to the example illustration described in connection with FIG. 5, the checksum threshold "$T_c$" is set to twenty (or a smaller value), the degree threshold "$T_d$" is set to two, and the one or more predefined values are set to two and three. In this illustration, if the checksum is less than twenty, the degree is smaller than or equal to two, and the predefined threshold "T" is equal to two or three, the bit flipping procedure is skipped. Otherwise, the bit flipping procedure is performed.

In an example, performing the bit flipping procedure by the BF decoder includes computing a flipping energy for a variable node of the selected set, performing a comparison of the flipping energy and the bit flipping threshold "T" (the same one that was used in the third comparisons described herein above), and flipping one or more bits of the variable node based on the comparison indicating the flipping energy is greater than the bit flipping threshold "T". The bit flipping procedure is further described in connection with FIG. 7.

At operation 612, the error correction system decodes the codeword. For instance, the BF decoder outputs decoded bits representing the decoded codewords. The bits are output based on whether the decoding procedure was performed or skipped.

FIG. 7 illustrates a further example flow 700 for decoding codewords by determining whether a bit flipping procedure can be skipped or not, in accordance with certain embodiments of the present disclosure. Some operations of the flow 700 can be implemented as specific sub-operations of the flow 600 of FIG. 6.

The flow 700 can start at operation 702, where the error correction system determines whether the parity-check equations used in the decoding of a codeword are satisfied. For instance, given the latest decoding iterations, the BF decoder determines whether the modulo two additions of the check nodes as represented in the parity-check matrix (e.g., the rows of this matrix) are zero. If so, the parity-check equations are satisfied, and operation 704 follow operation 702. Otherwise, operation 706 follows operation 702.

At operation 704, the error correction system determines a decoding success. Because the parity-check equations are satisfied, no additional decoding iterations are needed and the decoded bits can be output.

At operation 706, the error correction system determines whether the maximum number of decoding iterations has been reached. For instance, the error correction system maintains a counter "m", where the value of the counter is increased by one each time a decoding iteration is performed. The maximum number of decoding iterations can be predefined as a maximum allowable value (e.g., twenty or some other value). If the current value of the counter "m" is smaller than the maximum allowable value, operation 710 follows operation 706. Otherwise, operation 708 follows operation 706.

At operation 708, the error correction system determines a decoding failure 708. In particular, the parity-check equations are not satisfied and the maximum number of decoding iterations have been reached. In this case, the error correction system can dispatch the codeword to be decoded by a high error correction capability decoder, such as an MS decoder, if such a decoder is available.

At operation 710, the error correction system starts the next decoding iteration. In particular, the error correction system selects, at this decoding iteration "m" (e.g., where "m" is the current value of the counter), a next set of "$W_i$" variable nodes. As described in connection with operation 602, the variable nodes of this set have a same degree.

At operation 712, the error correction system compares the iteration number "m" (e.g., the current value of the counter) to a number threshold "$T_m$", the degree of the variable nodes of the selected set to a degree threshold "$T_d$", and the bit flipping threshold "T" to one or more predefined values. These comparisons correspond to the three comparisons described herein above in connection with FIG. 6. In addition or alternative to comparing the iteration number "m" (e.g., the current value of the counter) to the number threshold "$T_m$", the checksum of the codeword can be compared to a checksum threshold "$T_c$". If the iteration number "m" is smaller than the number threshold "$T_m$" (or the checksum is greater than the checksum threshold "$T_c$")P the degree is smaller than a degree threshold "$T_d$", and the bit flipping threshold "T" is equal to any of the one or more predefined values, operation 714 follows operation 712. Otherwise, operation 716 follows operation 714.

At operation 714, the error correction system determines whether all of the variable nodes have been selected yet in the decoding iteration "m". This indicates that the error correction system has skipped performing the bit flipping decoding procedure for the "$W_i$" variable nodes selected at operation 710. If all the variable nodes have not been selected yet, operation 710 follows operation 714, where the error correction system selects the next set of "$W_i$" variable nodes to be further evaluated during the decoding iteration "m". Otherwise, operation 726 follows operation 714, where the error correction system increases the counter of the decoding iteration (e.g., "m=m+1") to start a next decoding iteration as applicable. Operation 706 follows operation 726 to determine whether "m+1" exceeds the maximum allowable number of decoding iterations.

At operation 716, the error correction system starts the bit flipping procedure. In particular, the error correction system computes a bit flipping energy for each variable node in the selected set. Different techniques are available to compute the bit flipping energy for a variable node. For example, the bit flipping energy is the number of unsatisfied check nodes that are connected to the variable node.

At operation 718, the error correction system compares the bit flipping energy of each of the variable nodes of the selected set to the bit flipping threshold "T". If a bit flipping energy of a variable node exceeds the bit flipping threshold "T", the one or more bits represented by the variable node are flipped. Otherwise, the one or more bits are not flipped.

At operation 720, the error correction system updates the CRC and checksum of the codeword. This operation is performed only if any of the bits have been flipped. If no bits were flipped (e.g., all the flipping energies were smaller than the bit flipping threshold "T"), operation 720 can be skipped. The CRC can be updated by a CRC decoder and the checksum can be updated based on the check nodes (e.g., based on the number of unsatisfied check nodes).

At operation 722, the error correction system determines whether the checksum is equal to zero or not. If so, operation 704 follows operation 722, where a decoding success is determined. Otherwise, operation 724 follows operation 722.

At operation 724, the error correction system determines whether the CRC update was successful and whether the checksum is smaller than a checksum threshold "$T_s$" (which can be the same as or different from the checksum threshold "$T_c$"). The CRC success can be an output of the CRC decoder. If both conditions are satisfied, operation 704 follows operation 724, where a decoding success is determined. Otherwise, operation 714 follows operation 724.

Figure 8:
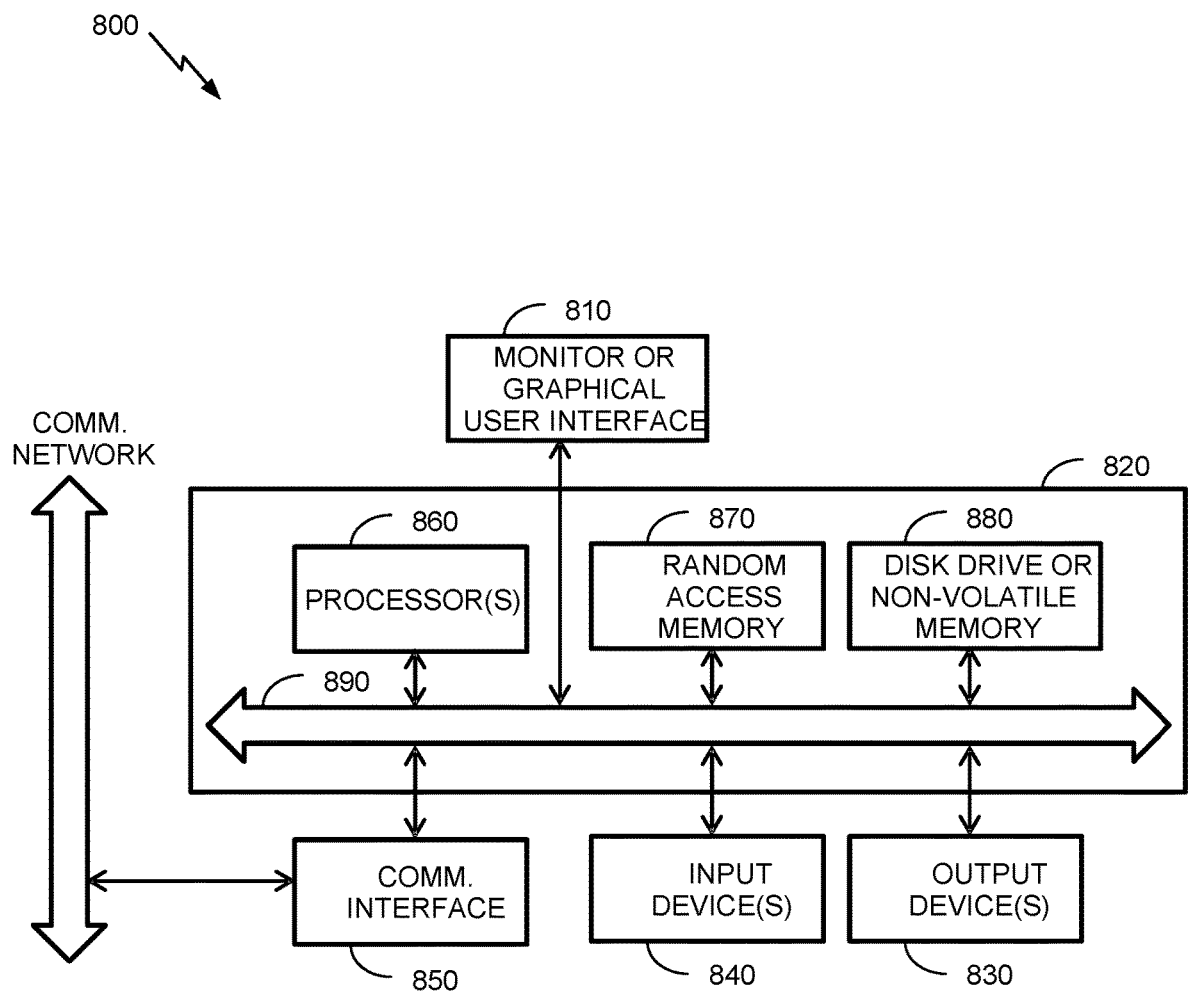
FIG. 8 illustrates one potential implementation of a system which may be used, according to certain embodiments of the present disclosure.

FIG. 8 illustrates one potential implementation of a system which may be used, according to certain embodiments of the present disclosure. FIG. 8 is merely illustrative of an embodiment of the present disclosure and does not limit the scope of the disclosure as recited in the claims. In one embodiment, the system is a computer system 800 that typically includes a monitor 810, a computer 820, user output devices 830, user input devices 840, communications interface 850, and the like.

As shown in FIG. 8, the computer 820 may include a processor(s) 860 that communicates with a number of peripheral devices via a bus subsystem 890. These peripheral devices may include the user output devices 830, the user input devices 840, the communications interface 850, and a storage subsystem, such as random access memory (RAM) 870 and disk drive 880.

The user input devices 840 include all possible types of devices and mechanisms for inputting information to the computer system 820. These may include a keyboard, a keypad, a touch screen incorporated into the display, audio input devices such as voice recognition systems, microphones, and other types of input devices. In various embodiments, the user input devices 840 are typically embodied as a computer mouse, a trackball, a track pad, a joystick, wireless remote, drawing tablet, voice command system, eye tracking system, and the like. The user input devices 840 typically allow a user to select objects, icons, text and the like that appear on the monitor 810 via a command such as a click of a button or the like.

The user output devices 830 include all possible types of devices and mechanisms for outputting information from the computer 820. These may include a display (e.g., the monitor 810), non-visual displays such as audio output devices, etc.

The communications interface 850 provides an interface to other communication networks and devices. The communications interface 850 may serve as an interface for receiving data from and transmitting data to other systems. Embodiments of the communications interface 850 typically include an Ethernet card, a modem (telephone, satellite, cable, ISDN), (asynchronous) digital subscriber line (DSL) unit, FireWire interface, USB interface, and the like. For example, the communications interface 850 may be coupled to a computer network, to a FireWire bus, or the like. In other embodiments, the communications interfaces 850 may be physically integrated on the motherboard of the computer 820, and may be a software program, such as soft DSL, or the like.

In various embodiments, the computer system 800 may also include software that enables communications over a network such as the HTTP, TCP/IP, RTP/RTSP protocols, and the like. In alternative embodiments of the present disclosure, other communications software and transfer protocols may also be used, for example IPX, UDP or the like. In some embodiments, the computer 820 includes one or more Xeon microprocessors from Intel as the processor(s) 860. Further, in one embodiment, the computer 820 includes a UNIX-based operating system.

The RAM 870 and the disk drive 880 are examples of tangible media configured to store data such as embodiments of the present disclosure, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. The RAM 870 and the disk drive 880 may be configured to store the basic programming and data constructs that provide the functionality of the present disclosure.

Software code modules and instructions that provide the functionality of the present disclosure may be stored in the RAM 870 and the disk drive 880. These software modules may be executed by the processor(s) 860. The RAM 870 and the disk drive 880 may also provide a repository for storing data used in accordance with the present disclosure.

The RAM 870 and the disk drive 880 may include a number of memories including a main random access memory (RAM) for storage of instructions and data during program execution and a read only memory (ROM) in which fixed non-transitory instructions are stored. The RAM 870 and the disk drive 880 may include a file storage subsystem providing persistent (non-volatile) storage for program and data files. The RAM 870 and the disk drive 880 may also include removable storage systems, such as removable flash memory.

The bus subsystem 890 provides a mechanism for letting the various components and subsystems of the computer 820 communicate with each other as intended. Although the bus subsystem 890 is shown schematically as a single bus, alternative embodiments of the bus subsystem may utilize multiple busses.

FIG. 8 is representative of a computer system capable of embodying the present disclosure. It will be readily apparent to one of ordinary skill in the art that many other hardware and software configurations are suitable for use with the present disclosure. For example, the computer may be a desktop, portable, rack-mounted, or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc.; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present disclosure can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the disclosure is not limited to the details provided. There are many alternative ways of implementing the disclosure. The disclosed embodiments are illustrative and not restrictive.

What is claimed is:

1. A method for decoding a low density parity check (LDPC) codeword, the method implemented by an error correction system that comprises a bit flipping (BF) decoder using a bit flipping procedure, the method comprising:

during a decoding iteration and prior to performing the bit flipping procedure:

selecting a set of variable nodes;

determining a degree of a variable node of the set, wherein the degree is the same for the variable nodes of the set;

determining a decoding factor that comprises at least one of: an iteration number "m" of the decoding iteration or a checksum of the LDPC codeword, wherein the iteration number "m" is an integer equal to or greater than one;

determining a bit flipping threshold "T", wherein the bit flipping threshold "T" is predefined for the bit flipping procedure based on the iteration number "m"; and generating a decision indicating whether to perform or to skip the bit flipping procedure, wherein the decision is generated based on the degree, the decoding factor, and the bit flipping threshold "T", and wherein the LDPC codeword is decoded based on the decision.

2. The method of claim 1, further comprising:
performing a first comparison between the degree of the variable node and a degree threshold, wherein the decision is generated based on an outcome of the first comparison.

3. The method of claim 2, wherein the degree threshold is equal to or less than five.

4. The method of claim 2, wherein the decoding factor comprises the iteration number "m", the method further comprising:
performing a second comparison between the iteration number "m" and a number threshold; and
performing a third comparison between the bit flipping threshold "T" and one or more predefined values,
wherein the decision is generated based on an outcome of the second comparison and an outcome of the third comparison.

5. The method of claim 4, wherein each one of the one or more predefined values is a different value within a range that is defined based on the degree threshold.

6. The method of claim 4, wherein the decision is to skip performing the bit flipping procedure based on (i) the first comparison indicating that the degree is smaller than the degree threshold, (ii) the second comparison indicating that the iteration number "m" is smaller than the number threshold, and (iii) the third comparison indicating that the bit flipping threshold "T" is equal to any of the one or more predefined values.

7. The method of claim 4, wherein the decision is to perform the bit flipping procedure based on any of: (i) the first comparison indicating that the degree is greater than the degree threshold, (ii) the second comparison indicating that the iteration number "m" is greater than the number threshold, or (iii) the third comparison indicating that the bit flipping threshold "T" is not equal to any of the one or more predefined values.

8. The method of claim 2, wherein the decoding factor comprises the checksum, the method further comprising:
performing a second comparison between the checksum and a checksum threshold; and
performing a third comparison between the bit flipping threshold "T" and one or more predefined values,
wherein the decision is generated based on an outcome of the second comparison and an outcome of the third comparison.

9. The method of claim 8, wherein the decision is to skip performing the bit flipping procedure based on (i) the first comparison indicating that the degree is smaller than the degree threshold, (ii) the second comparison indicating that the checksum is greater than the checksum threshold, and (iii) the third comparison indicating that the bit flipping threshold "T" is equal to any of the one or more predefined values.

10. The method of claim 8, wherein the decision is to perform the bit flipping procedure based on any of: (i) the first comparison indicating that the degree is greater than the degree threshold, (ii) the second comparison indicating that the iteration number "m" is smaller than the checksum threshold, or (iii) the third comparison indicating that the bit flipping threshold "T" is not equal to any of the one or more predefined values.

11. The method of claim 1, wherein the decision is to perform the bit flipping procedure, and wherein performing the bit flipping procedure comprises:
computing a flipping energy for the variable node;
performing a comparison of the flipping energy and the bit flipping threshold "T"; and
flipping one or more bits of the variable node based on the comparison indicating the flipping energy is greater than the bit flipping threshold "T".

12. An error correction system for decoding a low density parity check (LDPC) codeword, the error correction system comprising:
a bit flipping (BF) decoder configured to, during a decoding iteration and prior to performing a bit flipping procedure:
select a set of variable nodes;
determine a degree of a variable node of the set, wherein the degree is the same for the variable nodes of the set;
determine a decoding factor that comprises at least one of: an iteration number "m" of the decoding iteration or a checksum of the LDPC codeword, wherein the iteration number "m" is an integer equal to or greater than one;
determine a bit flipping threshold "T", wherein the bit flipping threshold "T" is predefined for the bit flipping procedure based on the iteration number "m";
generate a decision indicating whether to perform or to skip the bit flipping procedure, wherein the decision is generated based on the degree, the decoding factor, and the bit flipping threshold "T"; and
decode the LDPC codeword based on the decision.

13. The error correction system of claim 12, wherein the BF decoder is further configured to:
perform a first comparison between the degree of the variable node and a degree threshold, wherein the decision is generated based on an outcome of the first comparison.

14. The error correction system of claim 13, wherein the degree threshold is equal to or less than five.

15. The error correction system of claim 13, wherein the decoding factor comprises the iteration number "m", and wherein the BF decoder is further configured to:
perform a second comparison between the iteration number "m" and a number threshold; and
perform a third comparison between the bit flipping threshold "T" and one or more predefined values,
wherein the decision is generated based on an outcome of the second comparison and an outcome of the third comparison.

16. The error correction system of claim 15, wherein each one of the one or more predefined values is a different value within a range that is defined based on the degree threshold.

17. The error correction system of claim 15, wherein the decision is to skip performing the bit flipping procedure based on (i) the first comparison indicating that the degree is smaller than the degree threshold, (ii) the second comparison indicating that the iteration number "m" is smaller than the number threshold, and (iii) the third comparison indicating that the bit flipping threshold "T" is equal to any of the one or more predefined values.

18. A memory device comprising an error correction system and storing computer-readable instructions, that upon execution by the error correction system that comprises a bit flipping (BF) decoder using a bit flipping procedure for decoding a low density parity check (LDPC) codeword, cause the error correction system to perform operations comprising:

during a decoding iteration and prior to performing the bit flipping procedure:

selecting a set of variable nodes;

determining a degree of a variable node of the set, wherein the degree is the same for the variable nodes of the set;

determining a decoding factor that comprises at least one of: an iteration number "m" of the decoding iteration or a checksum of the LDPC codeword, wherein the iteration number "m" is an integer equal to or greater than one;

determining a bit flipping threshold "T", wherein the bit flipping threshold "T" is predefined for the bit flipping procedure based on the iteration number "m"; and generating, a decision indicating whether to perform or to skip the bit flipping procedure, wherein the decision is generated based on the degree, the decoding factor, and the bit flipping threshold "T", and wherein the LDPC codeword is decoded based on the decision.

19. The error correction system of claim 18, wherein the operations further comprise:

performing a first comparison between the degree of the variable node and a degree threshold, wherein the decision is generated based on an outcome of the first comparison.

20. The memory device of claim 19, wherein the decoding factor comprises the checksum, wherein the operations further comprise:

performing a second comparison between the checksum and a checksum threshold; and performing a third comparison between the bit flipping threshold "T" and one or more predefined values, wherein the decision is generated based on an outcome of the second comparison and an outcome of the third comparison.

* * * * *